(12) United States Patent
Lee et al.

(10) Patent No.: US 10,177,284 B2
(45) Date of Patent: Jan. 8, 2019

(54) ULTRAVIOLET LIGHT EMITTING DIODE AND METHOD OF MANUFACTURING THE SAME

(71) Applicant: GWANGJU INSTITUTE OF SCIENCE AND TECHNOLOGY, Gwangju (KR)

(72) Inventors: Dong-Seon Lee, Gwangju (KR); Duk-Jo Kong, Gwangju (KR); Jun-Yeob Lee, Gwangju (KR); Mun-Do Park, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 15/495,050

(22) Filed: Apr. 24, 2017

(65) Prior Publication Data

US 2017/0309788 A1  Oct. 26, 2017

(30) Foreign Application Priority Data

Apr. 26, 2016  (KR) .......................... 10-2016-0051009

(51) Int. Cl.
*H01L 33/48*  (2010.01)
*H01L 33/00*  (2010.01)
*H01L 33/62*  (2010.01)
*H01L 33/24*  (2010.01)
*H01L 33/32*  (2010.01)
*H01L 33/46*  (2010.01)

(52) U.S. Cl.
CPC ........ *H01L 33/486* (2013.01); *H01L 33/0075* (2013.01); *H01L 33/24* (2013.01); *H01L 33/62* (2013.01); *H01L 33/32* (2013.01); *H01L 33/46* (2013.01); *H01L 2933/0025* (2013.01); *H01L 2933/0066* (2013.01)

(58) Field of Classification Search
CPC ... H01L 33/486; H01L 33/62; H01L 33/0075; H01L 33/46; H01L 33/32; H01L 2933/0066; H01L 2933/0025
USPC ......... 257/76, 183, 13, 432, 88; 438/637, 23
See application file for complete search history.

(56) References Cited

U.S. PATENT DOCUMENTS 9,153,545 B2 * 10/2015 Yamamoto .......... H01L 25/0753
2010/0252861 A1 * 10/2010 Lochtefeld .......... H01L 21/0243
257/183
2014/0346437 A1 * 11/2014 Sim ........................ H01L 33/06
257/13

(Continued)

FOREIGN PATENT DOCUMENTS

JP    2001308458 A    11/2001
JP    2007201018 A    8/2007
JP    2007201019 A    8/2007

*Primary Examiner* — Bo Fan
(74) *Attorney, Agent, or Firm* — Hauptman Ham, LLP

(57) ABSTRACT

A sidewall light emitting ultraviolet light emitting diode and a method of manufacturing thereof are disclosed. A light emitting structure is formed in an active region recessed from a substrate surface, and the light emitting structure is formed by growth in a direction parallel to the surface of the substrate. Also, a reflective metal layer is formed above or below the light emitting structure such that ultraviolet light can be released in a second direction perpendicular to a first direction which is the growth direction of the light emitting structure.

11 Claims, 5 Drawing Sheets

(56) References Cited

U.S. PATENT DOCUMENTS

2015/0041755 A1* 2/2015 Zhang .................... H01L 33/12
257/13

\* cited by examiner

ULTRAVIOLET LIGHT EMITTING DIODE AND METHOD OF MANUFACTURING THE SAME

CLAIM FOR PRIORITY

This application claims priority to Korean Patent Application No. 10-2016-0051009 filed on Apr. 26, 2016 in the Korean Intellectual Property Office (KIPO), the entire contents of which are hereby incorporated by reference.

TECHNICAL FIELD

The present invention relates to an ultraviolet light emitting diode and a manufacturing method thereof and, more specifically, to an ultraviolet light emitting diode emitting ultraviolet light in a lateral direction of a layer structure and a manufacturing method thereof.

BACKGROUND ART

Ultraviolet light emitting diodes emit light of wavelength ranging from 100 nm to 400 nm and are classified into UVA, UVB, and UVC in the industry depending on the nature of the generated light.

Commercialized ultraviolet light emitting diodes are based on AlGaN material and is characterized by having emission wavelength determined by the fraction of Al. That is, higher fraction of Al in quantum wells results in shorter wavelength light. Also, while the manufacturing process is similar to the conventional blue light emitting diodes, there are specific differences for formation of p-type semiconductor layers.

That is, in order to form a p-type semiconductor layer in an ultraviolet light emitting diode, Mg is used as a dopant in an AlGaN compound semiconductor layer. However, the difference between the valence band energy in AlGaN and the electronic energy levels of Mg is 0.35 eV. This energy difference is very large and contributes to the difficulty activating the dopants in a p-type semiconductor layer to form holes.

For example, in the case of a p-type semiconductor layer used in a blue light emitting diode, the difference between the valence band energy in GaN and the electronic energy levels of Mg is 0.15 eV to 0.17 eV. In order to form holes in GaN by activating the dopants, electrons in GaN need to move to the Mg electronic levels, and, for this to happen, energy larger than 0.15 eV to 0.17 eV needs to be supplied. In order to achieve this, in a blue light emitting diode, a p-type semiconductor layer is formed using an MOCVD process, and a subsequent thermal processing at about 700° C. or higher is accompanied. However, even in the case of performing a thermal processing, the extent of activation is known to remain at about 10%.

On the other hand, in an ultraviolet light emitting diode utilizing AlGaN as a the base material, even in the case of using Mg dopant in order to form a p-type semiconductor layer, there is significant limitation to forming holes. That is, because the energy level difference between AlGaN and Mg is relatively very high, dopant activation level is low. It is known in the industry that the dopant activation level is approximately 1% to 3%. Accordingly, even in the case of forming a p-type semiconductor layer using AlGaN, the p-type semiconductor layer has high resistivity due to low hole density, and the amount of holes supplied to a quantum well structure is small such that light emitting action with enough brightness cannot be achieved.

To address the aforementioned problem, a p-type GaN layer is additionally introduced on top of the p-type AlGaN. That is, through the introduction of a p-type GaN layer, a hole density necessary for light emitting action can be achieved. However, the above described structure has a serious problem during light emitting action. This is because ultraviolet light generated in a quantum well structure is absorbed by the p-type GaN layer due to the bandgap energy of the GaN layer.

Therefore, ultraviolet light generated in a quantum well structure is significantly prevented from escaping outside due to mostly being absorbed.

DISCLOSURE OF INVENTION

Technical Problem

The present invention is directed to providing an ultraviolet light emitting diode for which light is emitted through a lateral surface of a layer structure.

The present invention is also directed to providing a manufacturing method for an ultraviolet light emitting diode that achieves light emission through a lateral surface of a layer structure.

Technical Solution

The present invention provides an ultraviolet light emitting diode comprising a substrate; an active region recessed from a surface of the substrate and exposing a lower surface and side surfaces of the substrate; an insulating material layer formed above the active region and on side surfaces of the active region and exposing a side surface of the active region; a light emitting structure having an n-type semiconductor layer, an active layer, and a p-type semiconductor layer grown in a first direction from the exposed side surface of the active region; a negative electrode formed on the n-type semiconductor layer; and a positive electrode formed on the p-type semiconductor layer.

The present invention also provides an ultraviolet light emitting diode comprising an active region defined by a region recessed from a surface of a substrate; a light emitting structure formed in a first direction in the active region, having an n-type semiconductor layer and a p-type semiconductor layer, and forming ultraviolet light; a negative electrode electrically connected to the n-type semiconductor layer of the light emitting structure; and a positive electrode electrically connected to the p-type semiconductor layer, wherein the ultraviolet light is released in a second direction perpendicular to the first direction which is the direction in which the light emitting structure is formed.

The present invention also provides a method of manufacturing an ultraviolet light emitting diode comprising forming an active region recessed from a surface of a substrate through selective etching of the substrate; forming an insulating material layer exposing a sidewall of the active region and shielding the top of a protrusion of the substrate, a lower surface of the active region, and the remaining sidewalls of the active region; forming a light emitting structure having an n-type semiconductor layer, an active layer, and a p-type semiconductor layer in a first direction parallel to the surface of the substrate with the insulating material layer at the terminal end of the growth from the exposed sidewall of the active region; and forming a negative electrode on the n-type semiconductor layer and a positive electrode on the p-type semiconductor.

Advantageous Effects

According to the present invention, a negative electrode and a positive electrode are formed in a second direction perpendicular to a first direction which is the crystal growth direction for forming a light emitting structure. That is, electrodes are formed on a side surface along the growth direction. Also, crystal growth proceeds in a direction parallel to the substrate surface and is limited within the active region recessed from the surface of the substrate. Accordingly, a plurality of light emitting structures with an identical characteristic and size may be formed without an additional separation processing.

In particular, while ultraviolet light formed in the active layer may be absorbed by the p-type semiconductor layer disposed in the crystal growth direction, light may easily be released to outside by a reflective metal layer disposed below or above the active layer. Accordingly, light extraction efficiency may be increased. Also, there is an advantage in which a desired ultraviolet light intensity may be obtained by selecting a size of the active region, enabling flexible layouts and forming electrodes in the same plane on the wiring.

Also, in the case of an ultraviolet light emitting diode grown in c-axis growth direction, while the generated ultraviolet light partially propagates in the c-axis direction, a substantial portion is released in the crystal growth direction perpendicular to the c-axis. Accordingly, the ultraviolet light emitting structure of the present invention may maximize light emitting through a side surface which is perpendicular to the crystal growth direction and thus improve light extraction.

MODE OF INVENTION

Figure 1:
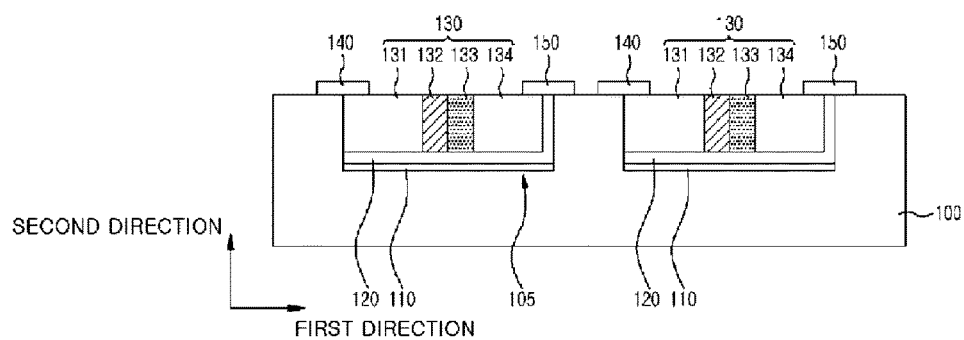
FIG. 1 is a cross-sectional view of an ultraviolet light emitting diode according to an exemplary first embodiment of the present invention.

While the present invention may be modified in various ways and implemented in many forms, specific embodiments are described in the drawings and explained in detail. However, there is no intent to limit the present invention to the specific disclosure, and it should be understood that the present invention includes all modifications, equivalents, and alternatives included in the idea and technical scope thereof. In describing each of the drawings, like reference numerals are used to denote like elements.

Unless otherwise defined, all terms including technical and scientific terms used herein each have the same meaning generally understood by those of ordinary knowledge in the art to which the present invention belongs. Generally used terms, such as terms defined in dictionaries, should each be interpreted by a meaning consistent within the context of related technologies and should not be interpreted by an ideal or excessively formal meaning unless clearly defined so in the present invention.

Hereinafter, exemplary embodiments of the present invention are described in further detail with references to accompanying drawings.

First Embodiment

FIG. 1 is a cross-sectional view of an ultraviolet light emitting diode according to an exemplary first embodiment of the present invention.

Referring to FIG. 1, the ultraviolet light emitting diode of the present embodiment includes a substrate 100, a reflective metal layer 110, an insulating material layer 120, a light emitting structure 130, a negative electrode 140, and a positive electrode 150.

The substrate 100 may be $Al_2O_3$, GaN, or AlN. However, the substrate 100 preferably has a lattice constant and a crystal structure that facilitate formation of the light emitting structure 130. For example, the substrate 100 preferably has a wurzite structure with a first direction that is the c-axis direction.

Also, the substrate 100 may be a particular membrane formed on an arbitrary substrate. For example, the substrate 100 may be a GaN layer formed on a sapphire substrate.

Also, the substrate 100 is not provided as a smooth substrate and is provided with an active region 105 defined therein. The active region 105 refers to a region recessed from a surface of the substrate 100, and the light emitting structure 130 is formed in the active region 105. That is, compound semiconductor crystal growth occurs in the active region 105 recessed from the surface of the substrate 100. Also, it is preferable that the crystal growth direction is the first direction parallel to the substrate.

The active region 105 defined by the recession from the surface of the substrate 100 exposes a surface of the substrate 100 as a lower surface and exposes a side surface of a protrusion of the substrate 100 as a side surface. Also, the lower surface and the side surface may be different materials. In the case of using a compound semiconductor layer formed on a growth substrate as the substrate 100, the side surface of the substrate 100 may include the compound semiconductor layer as long as the surface of the growth substrate is exposed by selective etching of the compound semiconductor layer.

The reflective metal layer 110 is provided on the substrate 100. In particular, the reflective metal layer 110 is formed on the lower surface of the active region 105 and is formed in the recessed portion of the substrate 100. Ultraviolet light formed in the light emitting structure 130 is released in a second direction due to the reflective metal layer 110.

The reflective metal layer 110 may be Cr, Ag, or an alloy thereof and may be any material that can function as a light reflector.

The insulating material layer 120 is provided on the reflective metal layer 110. The insulating material layer is formed on the lower surface of the active region 105, and a portion of the insulating material layer 120 is formed on the sidewall of the active region 105. The insulating material layer 120 may include $SiO_2$ or SiN and may be any material that can retain form and material properties without fusing into other materials during a formation process of the light emitting structure 130.

Also, the insulating material layer 120 is formed such that a portion of the sidewall of the substrate 100 that defines the active region 105 is exposed.

The light emitting structure 130 is formed on the insulating material layer 120. The light emitting structure 130 is grown such that growth is in the first direction which is parallel to the substrate 100. The light emitting structure 130 grown in the first direction contacts a sidewall of the substrate 100 in one direction along the first direction and contacts the insulating material layer 120 in the other direction along the first direction.

The light emitting structure 130 has an n-type semiconductor layer 131, an active layer 132, a p-type junction layer 133, and a p-type semiconductor layer 134.

The n-type semiconductor layer 131 may be AlGaN, and Si may be used as a dopant. The n-type semiconductor layer 131 is formed using a conventional MOCVD process, TMAl is used as a precursor of Al, TMGa is used as a precursor of Ga, $NH_3$ is used as a precursor of N, and $SIH_4$ is used as a precursor of Si. In particular, the n-type semiconductor layer 131 may be formed from the inside sidewall of the substrate that define the active region 105, and a buffer layer or another functional membrane may be inserted between the sidewall of the substrate 100 and the n-type semiconductor layer 131 according to embodiments.

The active layer 132 is provided on the side surface extending in the first direction of the n-type semiconductor layer 131. The active layer 132 preferably has a multiple quantum well structure. Accordingly, the active layer 132 may include AlInGaN or AlGaN. The active layer 132 may be formed using a conventional MOCVD process, TMAl is used as a precursor of Al, TMIn is used as a precursor of In, TMGa is used as a precursor of Ga, and NH3 is used as a precursor of N. For forming the well layers, Al or In fraction is adjusted. That is, because the bandgap between the conduction band and the valance band varies depending on Al or In fraction, Al or In fraction is adjusted according to the wavelength of the intended ultraviolet light. Also, the barrier layers have a smaller Al or In fraction compared to the well layers.

The p-type junction layer 133 is provided on the side surface extending in the first direction of the active layer 132. The p-type junction layer 133 preferably is AlGaN. In particular, it is preferable that the active layer 132 is grown in the c-axis direction during crystal growth and that the side surface of the grown active layer 132 is exposed. Accordingly, the n-type semiconductor layer 131, the active layer 132, and the p-type junction layer 133 also may be grown in the c-axis direction. Accordingly, the p-type junction layer 133 growth is accomplished from the exposed terminal end of the growth in the first direction of the active layer 132. For forming the p-type junction layer 133, Mg is used as a dopant during crystal growth of AlGaN. Cp2Mg(Bis(cyclopentadienyl) magnesium) may be used as a precursor of the Mg dopant. However, even with Mg doping achieved, hole density is small in the p-type junction layer 133, and thus the holes contribute little to light emitting action.

The p-type semiconductor layer 134 is formed at the terminal end of the extension in the first direction of the p-type junction layer 133. The p-type semiconductor layer 134 is preferably GaN and with Mg used as a dopant. The p-type semiconductor layer 134 is extended in the first direction and is formed between the p-type junction layer 133 and the insulating material layer 120. Also, the p-type junction layer 133 has a form in which growth is in the first direction which is the c-axis direction and is formed to contact the insulating material layer 120 formed on the sidewall of the active region 105.

Also, an electron blocker layer may be provided between the active layer 132 and p-type junction layer 133 according to embodiments. The electron blocker layer prevents electrons introduced in the first direction towards the active layer 132 from overflowing to the p-type junction layer 133. For this, the electron blocker layer may include AlN or AlGaN.

Also, the negative electrode 140 is formed in the second direction from the n-type semiconductor layer 131 of the substrate 100. That is, the negative electrode 140 is formed on the n-type semiconductor layer 131, the negative electrode 140 is electrically connected to the n-type semiconductor layer 131, and a portion of the negative electrode 140 may be formed extending over the substrate 100 according to embodiments.

The positive electrode 150 is formed in the opposite direction from the negative electrode 140 with the active region 105 in the center. The positive electrode 150 is electrically connected to the p-type semiconductor layer 134. For this, the positive electrode 150 is formed on the p-type semiconductor layer 134. Also, a portion of the positive electrode 150 may be formed extending over the substrate 100 according to embodiments.

In FIG. 1, when a voltage is applied between the negative electrode 140 and the positive electrode 150, electrons in the n-type semiconductor layer 131 move to the active layer 132 in the first direction and holes in the p-type semiconductor layer 134 move to the active layer 132 in the opposite direction from the first direction. Due to the multiple quantum wells formed in the active layer 132, electrons and holes recombine and light emitting action is accomplished. However, ultraviolet light generated in the active layer 132 is released in the second direction perpendicular to the first direction due to the reflective metal layer 110.

Also, in FIG. 1, the p-type junction layer 133 may be omitted according to embodiments. For example, the p-type semiconductor layer 134 may also be directly formed from the active layer 132 in the first direction. AlGaN or GaN may be used as the p-type semiconductor layer 134.

FIGS. 2 to 7 are views for explaining a manufacturing method of the ultraviolet light emitting diode of FIG. 1 according to the first embodiment of the present invention.

Figure 2:
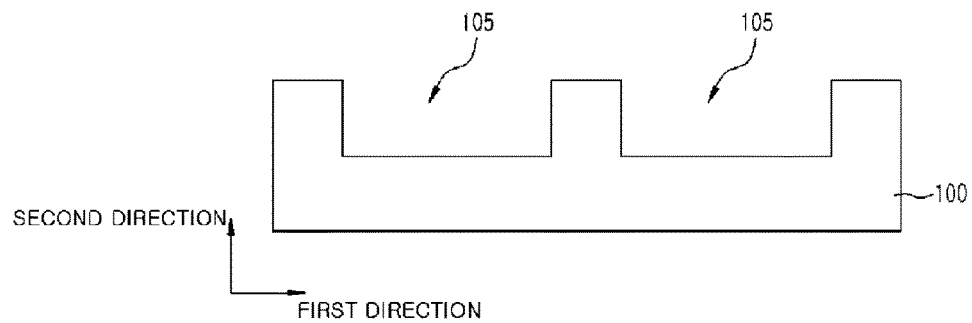
FIGS. 2 to 7 are views for explaining a manufacturing method of the ultraviolet light emitting diode of FIG. 1 according to the first embodiment of the present invention.

Referring to FIG. 2, the active region is formed by etch processing the substrate 100. The substrate 100 preferably has $Al_2O_3$, GaN, or AlN composition.

First, an etch mask is formed on a smoothly flat substrate surface. The etch mask may be formed by resist pattern formation in a process of applying a photoresist and subsequently exposing to light. The etch mask may be a hard mask including SiN, etc. When wet or dry etching is performed with the formed etch mask, substrate regions below the etch mask remain while other regions are etched. Through this, active region 105 recessed from the surface is formed. Also, the substrate 100 may refer to a particular membrane other than membranes that a person in the art considers as substrates for growing light emitting diodes. This is explained in FIG. 3 below.

Figure 3:
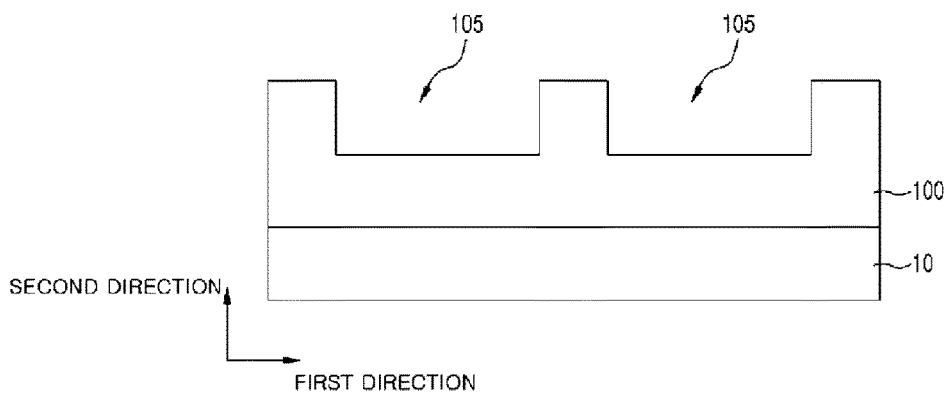

Referring to FIG. 3, a compound semiconductor layer may be formed on a growth substrate 10 using an MOCVD or an MOVPE process. The compound semiconductor layer is called the substrate 100 for convenience explanation. For example, the growth substrate 10 may be a sapphire substrate, and the substrate 100 which is a compound semiconductor layer may be GaN. However, the substrate 100 which is a compound semiconductor layer should preferably be dopant free. A compound semiconductor layer that is not doped has a non-conducting property.

Then, an etch mask is formed on the formed substrate 100 through a conventional photolithography process, and the active region 105 may be formed using the etch process described above.

Also, although it is indicated in FIG. 3 that the substrate 100 is exposed below the active region 105, the growth substrate 10 may be exposed according to etch depth with no consequence. When the lower surface of the active region 105 is the growth substrate 10 exposed due to etching, the lower surface and the side surface of the active region 105 may be different materials. That is, the side surface which is forming the substrate 100 may be a grown compound semiconductor and the lower surface of active region 105 may be the surface of the growth substrate 10.

Figure 4:
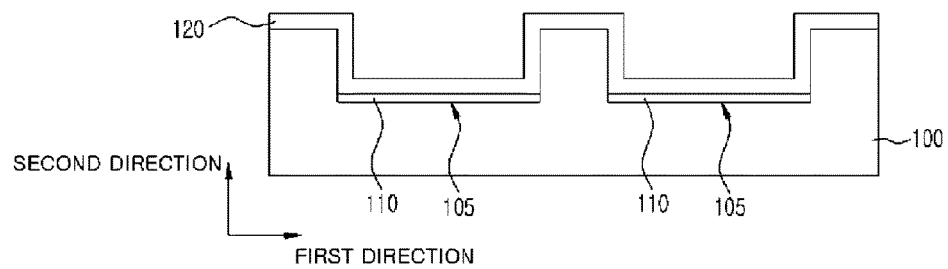

Referring to FIG. 4, the reflective metal layer 110 is formed on the substrate 100. The reflective metal layer 110 is formed below the active region 105. Also, the reflective metal layer 110 may be formed below a portion of the active region 105. The reflective metal layer 110 may also be formed using a lift-off process using a photoresist or a thermal deposition process using a fine metal mask, and the formation process is not particularly limited.

In case of using a fine metal mask, the fine mask corresponding to the lower surface of the active region 105 is open, and the reflective metal layer 110 may be deposited through the open region.

Subsequently, the insulating material layer 120 is formed on the entire front surface of the substrate 100 on which the reflective metal layer 110 is formed. The insulating material layer 120 is preferably $SiO_2$ or SiN. In particular, when the active layer 132 is formed using an MOCVD or an MOVPE process, any non-conductive and transparent material that does not result in the growth of the active layer 132 may be used as the insulating material layer 120. Through this, an insulating material layer 120 that shields the sidewall of the active region 105, the reflective metal layer 110, and the protrusion of substrate 100 is formed.

Figure 5:
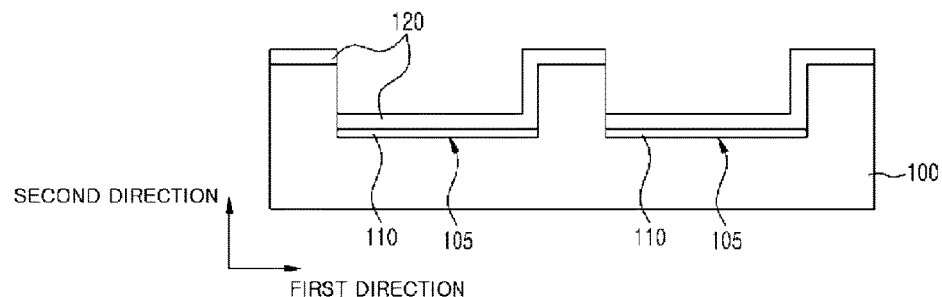

Referring to FIG. 5, the side surface of the active region 105 is exposed by selective etching the insulating material layer 120. Through this, a portion of the side surface of the protrusion of the substrate is exposed. Also, regions other than the exposed side surface of the active region 105 become shielded by the insulating material layer 120.

Selective etching of the insulating material layer 120 may be accomplished by faceted etching. For example, when dry etching is performed with a facet angle less than 45 degrees from the surface of the substrate 100, the surface facing the direction of the etchant progression has increased level of etching, and, through this, a side surface of the active region 105 is exposed. Also, selective etching of the insulating material layer 120 may be accomplished through wet or dry etching using a photoresist pattern used as an etch mask. The photoresist pattern is formed in a pattern to open a portion of the sidewall of the active region 105, and, by etching the open region, a sidewall of the active region 105 may be exposed.

Figure 6:
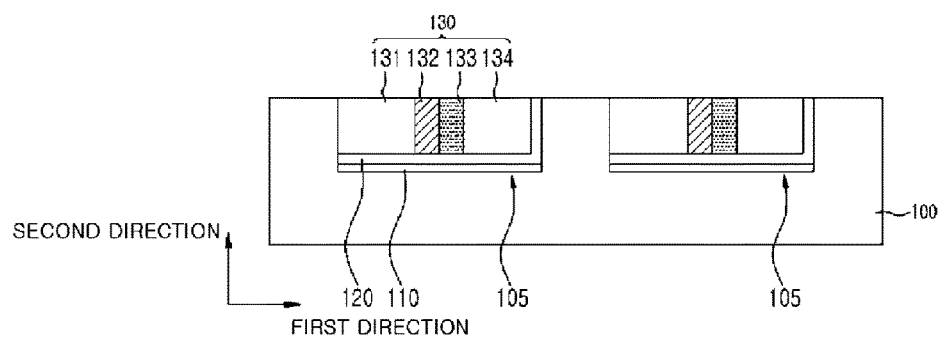

Referring to FIG. 6, growth of the compound semiconductor of the structure in FIG. 5 is performed. That is, the light emitting structure 130 is grown on the sidewall of the active region 105 opened in FIG. 5. For example, defining the active region 105 opened in FIG. 5 as the c-plane, the n-type semiconductor layer 131 is first formed on this. The n-type semiconductor layer 131 is AlGaN, and Si is used as a dopant. The crystal growth direction is the first direction, and, while crystal growth may progress in the second direction in some process designs, the rate of growth is insignificant compared to the growth in the first direction. Also, the lower surface of the active region 105 is shielded with the insulating material layer 120, and, because the sidewall opened in the active region 105 facing the sidewall of the active region 105 is also shielded by the insulating material layer 120, crystal growth is dominated by the growth in one direction.

Subsequently, the growth of the active layer 132 begins from the terminal end of the n-type semiconductor layer 131 grown in the first direction. The active layer 132 preferably has a multiple quantum well structure. The barrier and well layers of the active layer 132 preferably include AlInGaN or AlGaN.

Subsequently, the p-type junction layer 133 is formed through growth in the first direction on the terminal end of the growth of the active layer 132 grown in the first direction. The p-type junction layer 133 is AlGaN and has p-type conductivity due to using Mg as a dopant. The p-type junction layer 133 may accomplish relieving a lattice mismatch between the p-type semiconductor layer 134 and the active layer 132 grown later and may accomplish delivering holes supplied by the p-type semiconductor layer 134 to the active layer 132.

Also, the p-type semiconductor layer 134 is formed on the terminal end of the p-type junction layer 133 grown in the first direction. The p-type semiconductor layer 134 includes GaN, and Mg is used as a dopant. In particular, the p-type semiconductor layer 134 is grown in the first direction, and the growth ends at a sidewall of the protrusion of the substrate 100 protruding from the active region 105 or the insulating material layer 120 formed on a sidewall of the active region 105. Because the compound semiconductor growth is stopped by the insulating material layer 120, a light emitting structure 130 that fills the recessed space of the active region 105 is formed.

Subsequently, the insulating material layer 120 formed on the protrusion of the substrate 100 that defines the active region 105 is removed. While the removal of the insulating material layer 120 formed on the protrusion of the substrate 100 may be accomplished using a conventional etching process, it is preferred that Chemical Mechanical Polishing be used. This may be defined as a planarizing process.

For example, even in the case the light emitting structure 130 is mainly grown in the first direction, there may still be partial growth in the second direction. The partial growth in the second direction causes a portion of the light emitting structure 130 to protrude higher than the protrusion of the substrate 100. There is an advantage in that this may be removed by Chemical Mechanical Polishing.

Through this, the active layer 132, the n-type semiconductor layer 131, and the p-type semiconductor layer 134 may be all exposed in the same plane.

Figure 7:
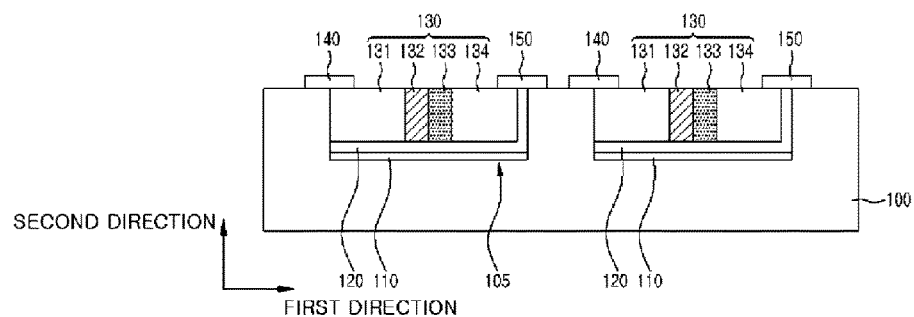

Referring to FIG. 7, a process for forming the negative electrode 140 and the positive electrode 150 for the structure in FIG. 6 is performed. The material for the negative electrode 140 and the positive electrode 150 is identical to the material used in a manufacturing process of a conventional ultraviolet light emitting diode.

However, the negative electrode 140 and the positive electrode 150 are formed in the same plane. Also, according to embodiments, the negative electrode 140 may be formed extending over the n-type semiconductor layer 131 and the protrusion of the substrate 100, and the positive electrode 150 may be formed extending over the p-type semiconductor layer 134 and the protrusion of the substrate 100.

In the present invention, the light emitting structure 130 is grown in the first direction parallel to the surface formed by the substrate 100. Also, the growth in the first direction is limited within the active region 105 recessed from the surface of the substrate 100. Ultraviolet light generated in the light emitting structure 130 is reflected by the reflective metal layer 110 provided on the lower surface of active region 105 and released in the second direction. Also, the positive electrode 150 and the negative electrode 140 are provided in the second direction from the lower surface of the substrate 100. That is, the negative electrode 140 and the positive electrode 150 are provided in the side surface of the growth progression direction.

Figure 8:
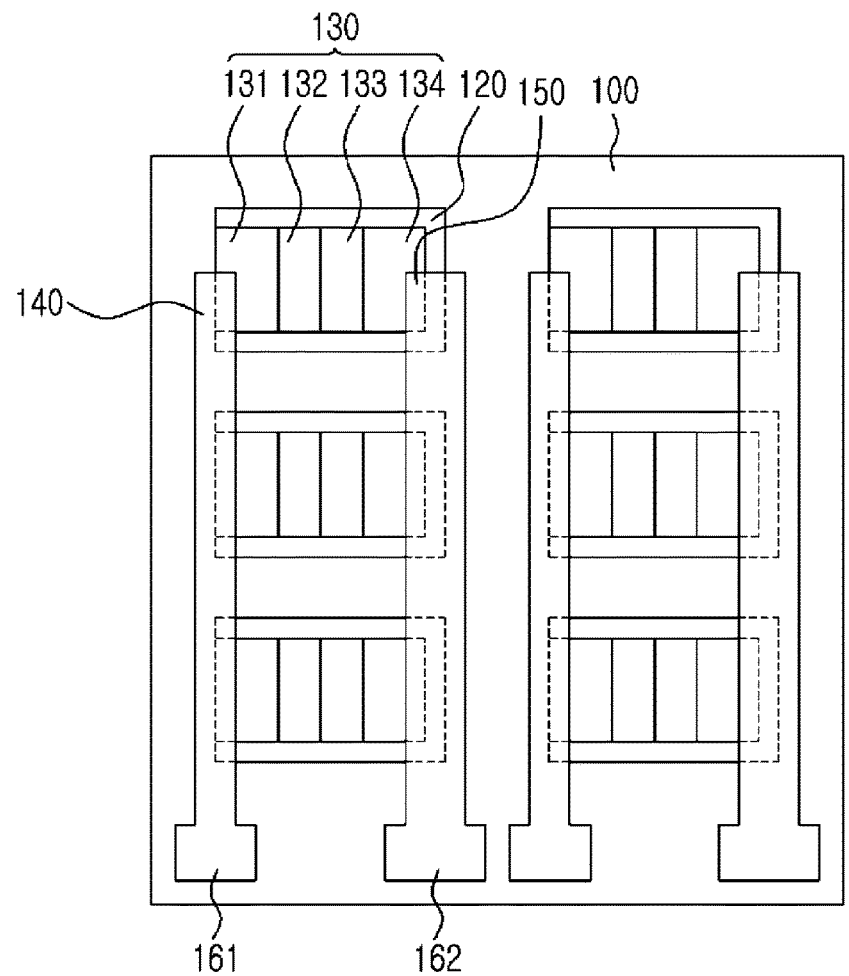
FIG. 8 is a see-through plan view of the ultraviolet light emitting diode according to the first embodiment of the present invention.

FIG. 8 is a see-through plan view of the ultraviolet light emitting diode according to the first embodiment of the present invention.

Referring to FIG. 8, while the structure of the reflective metal layer is omitted for convenience, the reflective metal layer should be understood as being provided on the lower surface of the recessed active region 105.

Also, the insulating material layer 120 is formed to surround the top of the reflective metal layer and the sidewall of the active region 105. However, the insulating material layer 120 exposes a portion of the sidewall of the protrusion of the substrate 100 or the active region 105. Crystal growth of the light emitting structure 130 is accomplished on the exposed sidewall of the substrate 100. Based on this, the n-type semiconductor layer 131, the active layer 132, the p-type junction layer 133, and the p-type semiconductor layer 134 that fill the active region 105 are formed.

The active region 105 may be formed in plurality, and the light emitting structure 130 that fill the active region 105 may also be formed in plurality. Also, the exposed surface of the light emitting structure 130 and the exposed surface of the substrate 100 are formed in the same plane. Accordingly, the negative electrode 140 and the positive electrode 150 electrically connecting each light emitting structure 130 may be formed in the same plane.

For example, as shown in FIG. 8, the negative electrode 140 may be a wiring type with n-type semiconductor layers 131 formed in a plurality of active regions 105 simultaneously connected thereto, and this is called the negative wiring. Also, the positive electrode 150 may be a wiring type with p-type semiconductor layers 134 simultaneously connected thereto, and this is called the positive wiring.

Also, the negative wiring is electrically connected to the negative contact pad 161, and the positive wiring is electrically connected to the positive contact pad 162. Through the formed wiring structure, a plurality of light emitting structures 130 may simultaneously accomplish light emitting action, and convenience during packaging processing is increased.

Second Embodiment

Figure 9:
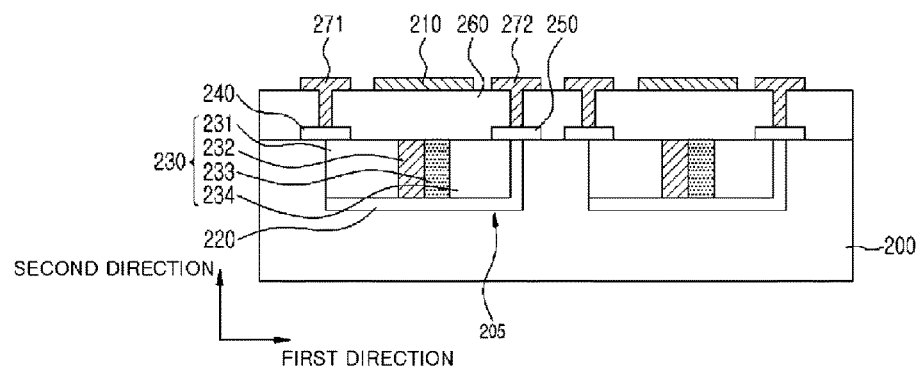
FIG. 9 is a cross-sectional view of an ultraviolet light emitting diode according to a second embodiment of the present invention.

FIG. 9 is a cross-sectional view of an ultraviolet light emitting diode according to a second embodiment of the present invention.

Referring to FIG. 9, an active region 205 is defined on a substrate 200. The material for the substrate 200 is identical to that described in FIG. 1.

In particular, the active region 205 defined by a recession from a surface of the substrate 200 exposes a surface of substrate 200 as a lower surface and exposes a sidewall of a protrusion of the substrate 200 as a side surface. Also, the side surface and the front surface of the substrate 200 that define the active region 205 may be different materials. In the case of using a compound semiconductor layer formed on a growth substrate as the substrate 200, the side surface of the substrate 200 may include the compound semiconductor layer as long as the surface of the growth substrate is exposed by selective etching of the compound semiconductor layer.

A sidewall of the active region 205 contacts a light emitting structure 230, and an insulating material layer 220 is provided on other sidewalls and the lower surface of the active region 205. The insulating material layer 220 is preferably $SiO_2$ or SiN.

Also, the recessed portion of the active region 205 is filled by the light emitting structure 230. The light emitting structure 230 may includes an n-type semiconductor layer 231 grown from the exposed sidewall of the substrate 200, an active layer 232, a p-type junction layer 233, and a p-type semiconductor layer 234, and the materials and formation method are identical to those explained in FIG. 1.

Also, a negative electrode 240 is formed on the n-type semiconductor layer 231, and a positive electrode 250 is formed on the p-type semiconductor layer 234. The negative electrode 240 and the positive electrode 250 may be formed in the same plane.

Also, an inter-layer insulating film 260 is formed on the surface of the substrate 200 on which the negative contact 240 and the positive contact 250 are formed, and via contacts 271, 272 are formed through the inter-layer insulating film 260. That is, a first via contact 271 is electrically connected to the negative contact 240 and a second via contact 272 is electrically connected to the positive contact 250. In particular, the inter-layer insulating film 260 preferably is made of a transparent material and may include $SiO_2$ or SiN.

A reflective metal layer 210 is formed on the inter-layer insulating film 260. The reflective metal layer 210 in FIG. 9 is shown to be formed in a second direction on the light emitting structure 230. That is, in FIG. 1, while accomplishing releasing ultraviolet light generated in a light emitting structure 130 in a second direction by being formed on the lower surface of an active region 105, the reflective metal layer 210 shown in FIG. 9 accomplishes releasing of ultraviolet light generated in the light emitting structure 230 in the opposite direction from the second direction towards the substrate 200. Also, the material of the reflective metal layer 210 is identical to the material explained in FIG. 1, and the reflective metal layer 210 is arranged such that ultraviolet light generated in the active layer 232 may be reflected in the opposite direction from the second direction.

FIGS. 10 to 13 are cross-sectional views for explaining a manufacturing method of the ultraviolet light emitting diode according to the second embodiment of the present invention.

Figure 10:
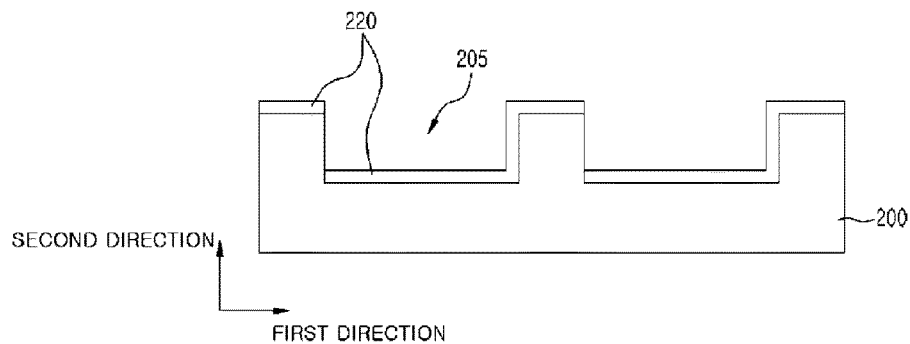
FIGS. 10 to 13 are cross-sectional views for explaining a manufacturing method of the ultraviolet light emitting diode according to the second embodiment of the present invention.

Referring to FIG. 10, the active region 205 is defined in the substrate 200 identically to FIGS. 2 and 3 of the first embodiment. As explained, the substrate 200 may be a conventional substrate for crystal growth and may be a semiconductor layer grown on a growth substrate.

The insulating material layer 220 is formed using a conventional deposition process on the substrate 200 for which the active region 205 recessed from the surface of the substrate 200 is defined, and a sidewall of the protrusion of the active region 205 is exposed through a process including faceted etching, etc. on the substrate 200 on which the insulating material layer 220 is formed. Accordingly, the insulating material layer 220 shields the top surface of the protrusion of the substrate 200, the lower surface and a portion of the side surface of the active region 205 and exposes other side surfaces of the active region 205.

Figure 11:
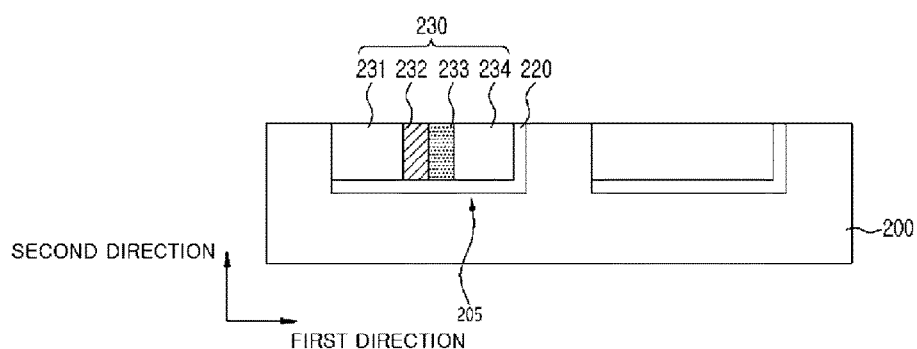

Referring to FIG. 11, the light emitting structure 230 is formed inside the active region 205 in which the insulating material layer 220 is formed. For the light emitting structure 230, the n-type semiconductor layer 231, the active layer 232, the p-type junction layer 233, and the p-type semiconductor layer 234 are sequentially formed on the crystal structure of the exposed sidewall of the active region 205 of the substrate 200, and the crystal growth occurs mainly in the first direction. Also, because crystal growth is inhibited on the insulating material layer 220, the sidewall of the insulating material layer 220 facing the exposed sidewall becomes the terminal end of the growth.

Subsequently, a process of planarizing the insulating material layer 220 formed on the protrusion of the substrate 200 is performed. Through this, the protrusion of the substrate 200, a portion of the insulating material layer 220, and a side surface of the grown light emitting structure 230 are exposed in the second direction as shown in FIG. 11. That is, the insulating material layer 220 formed on the protrusion of the substrate 200 is removed through the planarizing process.

Figure 12:
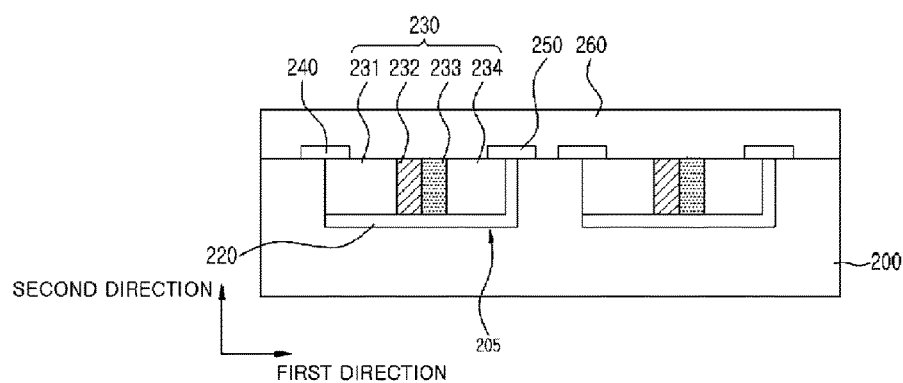

Referring to FIG. 12, the negative electrode 240 and the positive electrode 250 for the structure shown in FIG. 11 are formed. The negative electrode 240 and the positive electrode 250 may be formed through a conventional lift-off process using a photoresist. Also, the negative electrode 240 and the positive electrode 250 may be formed in the same plane. Subsequently, the inter-layer insulating film 260 that shields the negative electrode 240, the positive electrode 250, and the exposed side surface of the light emitting structure 230 may be formed. The inter-layer insulating film 260 may be formed using a conventional deposition process.

Figure 13:
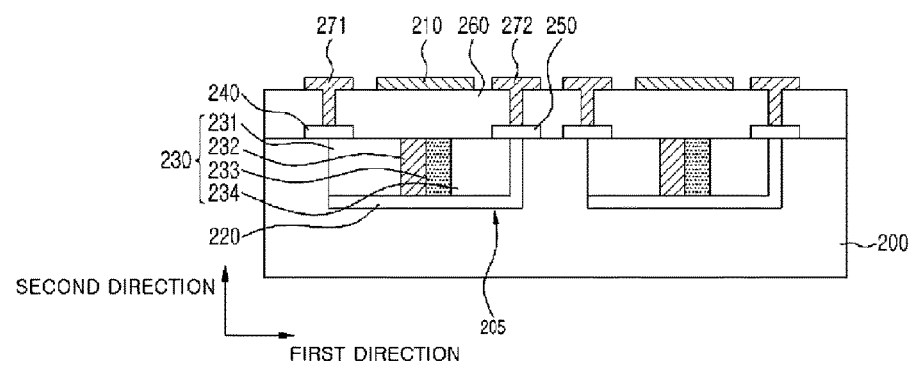

Referring to FIG. 13, via holes are formed on the negative electrode 240 and the positive electrode 250, and the via contacts 271, 271 are formed by filling the via holes with a metal material. Through this, the n-type semiconductor layer 231 and the p-type semiconductor layer 234 may be electrically connected to outside.

Also, the reflective metal layer 210 may be formed extending over the inter-layer insulating film 260 and active layer 232. According to embodiments, the reflective metal layer 210 may be formed first, and then the via contacts 271, 272 are subsequently formed.

Electrons moving in the first direction and holes moving in the opposite direction become quantum confined in the active layer 232, and light emitting action is accomplished due to recombination thereof. Ultraviolet light generated in the active layer 232 is released in the opposite direction from the second direction towards the substrate 200 due to the reflective metal layer 210 formed on the substrate 200 along the second direction.

According to the present invention, generated ultraviolet light propagates in a direction toward the substrate due to the reflective metal layer formed on the surface facing the substrate with the light emitting structure in the center. Also, the negative electrode and the positive electrode may be formed in the same plane, thus increasing the level of convenience for contact formation.

Also, in the present invention, the positive contact and the negative contact are formed in the second direction perpendicular to the first direction which is the crystal growth direction for forming the light emitting structure. That is, contacts are formed on the side surface of the crystal growth direction. Also, the crystal growth proceeds in a direction parallel to the surface of the substrate and is limited within the active region recessed from the substrate surface.

In particular, while a portion of ultraviolet light generated in the active layer may be absorbed by the p-type semiconductor layer positioned in the crystal growth direction, the ultraviolet light may easily be released to outside by the reflective metal layer disposed above or below the active layer. Accordingly, light extraction efficiency may be increased. Also, there is an advantage in which a desired ultraviolet light intensity may be obtained by selecting a size of the active region, enabling flexible layouts and forming electrodes in the same plane on the wiring.

DESCRIPTION OF REFERENCE NUMERALS 100, 200: substrate
110, 210: reflective metal layer
120, 220: insulating metal layer
130, 230: light emitting structure
140, 240: negative contact
150, 250: positive contact

The invention claimed is:

1. An ultraviolet light emitting diode comprising:
a substrate;
an active region recessed from a surface of the substrate and exposing a lower surface and side surfaces of the substrate;
an insulating material layer formed above the active region and on side surfaces of the active region and exposing a side surface of the active region;
a light emitting structure having an n-type semiconductor layer, an active layer, and a p-type semiconductor layer grown in a first direction from the exposed portion of the side surface of the active region;
a negative electrode formed on the n-type semiconductor layer; and
a positive electrode formed on the p-type semiconductor layer,
wherein the light emitting structure has a surface exposed in a second direction perpendicular to the first direction, and the negative electrode and the positive electrode are formed in a same plane as the exposed surface of the light emitting structure.

2. The ultraviolet light emitting diode of claim 1, wherein the substrate comprises $Al_2O_3$, GaN, or AlN.

3. The ultraviolet light emitting diode of claim 1, wherein the lower surface of the substrate and the side surfaces of the substrate are different materials.

4. The ultraviolet light emitting diode of claim 1, wherein the light emitting structure is formed in the active region.

5. The ultraviolet light emitting diode of claim 4, wherein the n-type semiconductor layer, the active layer, and the p-type semiconductor layer mainly have crystal growth in the c-axis direction.

6. The ultraviolet light emitting diode of claim 1, further comprising a reflective metal layer between the lower surface of the substrate and the insulating material layer.

7. The ultraviolet light emitting diode of claim 6, wherein the reflective metal layer guides the direction of light formed in the active layer in a second direction perpendicular to the first direction.

8. The ultraviolet light emitting diode of claim 1, further comprising:
an inter-layer insulating film formed on the light emitting structure, the negative electrode, and the positive electrode; and a reflective metal layer formed on the inter-layer insulating film and at a position corresponding to the active layer.

9. The ultraviolet light emitting diode of claim 8, further comprising:
a first via contact through the inter-layer insulating film electrically connected to the negative electrode; and
a second via contact through the inter-layer insulating film electrically connected to the positive electrode.

10. An ultraviolet light emitting diode comprising:
an active region defined by a region recessed from a surface of a substrate;
a light emitting structure formed in a first direction in the active region, having an n-type semiconductor layer and a p-type semiconductor layer, and forming ultraviolet light;
a negative electrode electrically connected to the n-type semiconductor layer of the light emitting structure; and
a positive electrode electrically connected to the p-type semiconductor layer, wherein
the ultraviolet light is released in a second direction perpendicular to the first direction which is the direction in which the light emitting structure is formed,
wherein the light emitting structure has a surface exposed in a second direction perpendicular to the first direction, and the negative electrode and the positive electrode are formed in a same plane as the exposed surface of the light emitting structure.

11. The ultraviolet light emitting diode of claim 10, wherein electrons of the n-type semiconductor layer and holes of the p-type semiconductor layer are supplied to an active layer by moving parallel to the surface of the substrate.

* * * * *